(12) United States Patent
Son et al.

(10) Patent No.: US 12,332,741 B2
(45) Date of Patent: Jun. 17, 2025

(54) MEMORY CONTROLLER PERFORMING ERROR CORRECTION AND OPERATING METHOD THEREOF

(71) Applicant: SK hynix Inc., Icheon (KR)

(72) Inventors: Jae Yong Son, Icheon (KR); Dae Sung Kim, Icheon (KR); Min Su Choi, Icheon (KR)

(73) Assignee: SK hynix Inc., Icheon-si (KR)

( * ) Notice: Subject to any disclaimer, the term of this patent is extended or adjusted under 35 U.S.C. 154(b) by 41 days.

(21) Appl. No.: 18/349,712

(22) Filed: Jul. 10, 2023

(65) Prior Publication Data

US 2024/0211345 A1 Jun. 27, 2024

(30) Foreign Application Priority Data

Dec. 22, 2022 (KR) ........................ 10-2022-0182284

(51) Int. Cl.
| | |
|---|---|
| G06F 11/10 | (2006.01) |
| G06F 11/07 | (2006.01) |
| G06F 11/14 | (2006.01) |
| H03M 13/11 | (2006.01) |

(52) U.S. Cl.
CPC ...... G06F 11/1068 (2013.01); G06F 11/0772 (2013.01); G06F 11/141 (2013.01); H03M 13/1108 (2013.01); H03M 13/1177 (2013.01)

(58) Field of Classification Search
CPC ............ G06F 11/1068; G06F 11/0772; G06F 11/141; G06F 11/1012; G06F 3/0658; G06F 11/1044; G06F 11/1048; G06F 11/1096; H03M 13/1108; H03M 13/1177
See application file for complete search history.

(56) References Cited

U.S. PATENT DOCUMENTS

| | | | |
|---|---|---|---|
| 9,680,504 B2 * | 6/2017 | Kim | H03M 13/1108 |
| 10,998,920 B1 * | 5/2021 | Tate | H03M 13/1111 |
| 11,265,021 B2 * | 3/2022 | Kim | H03M 13/1575 |
| 2015/0149871 A1 * | 5/2015 | Chen | G11C 11/5642 |
| | | | 714/773 |
| 2017/0236592 A1 * | 8/2017 | Alhussien | G11C 7/1006 |
| | | | 714/721 |
| 2019/0286516 A1 * | 9/2019 | Jacobvitz | H03M 13/3746 |
| 2020/0159447 A1 * | 5/2020 | Luo | G06F 3/0679 |
| 2022/0044702 A1 * | 2/2022 | Maeto | G11B 20/1889 |

FOREIGN PATENT DOCUMENTS

| | | |
|---|---|---|
| KR | 1020160074292 A | 6/2016 |
| KR | 1020170068681 A | 6/2017 |

* cited by examiner

*Primary Examiner* — Cynthia Britt (57) ABSTRACT

A memory device may include a read controller and an error correction circuit. The read controller may sequentially perform a plurality of read retry operations on a memory device. The error correction circuit may perform a plurality of first error correction decodings on read data respectively acquired from the plurality of read retry operations, store a plurality of Unsatisfied Syndrome Check (USC) values respectively produced by the plurality of first error correction decodings, and perform a second error correction decoding based on read data corresponding to a minimum USC value among the plurality of USC values.

20 Claims, 9 Drawing Sheets

$$\begin{bmatrix} 1 & 0 & 1 & 0 & 1 & 0 & 0 \\ 0 & 1 & 0 & 1 & 0 & 1 & 0 \\ 1 & 0 & 0 & 1 & 0 & 0 & 1 \end{bmatrix} \times \begin{bmatrix} C_{i1} \\ C_{i2} \\ C_{i3} \\ \vdots \\ C_{i7} \end{bmatrix} = \begin{bmatrix} S_{i1} \\ S_{i2} \\ S_{i3} \end{bmatrix}$$

H $\qquad$ $C_i^T$ $\qquad$ $S_i$

H = Parity Check Matrix
Ci = Read Data
Si = Syndrome

MEMORY CONTROLLER PERFORMING ERROR CORRECTION AND OPERATING METHOD THEREOF

CROSS-REFERENCE TO RELATED APPLICATION

The present application claims priority under 35 U.S.C. § 119(a) to Korean patent application number 10-2022-0182284 filed on Dec. 22, 2022, in the Korean Intellectual Property Office, the entire disclosure of which is incorporated by reference herein.

BACKGROUND

1. Technical Field

The present disclosure generally relates to a memory controller, and more particularly, to a memory controller for shortening an error correction time by reducing unnecessary error correction decoding, and an operating method of the memory controller.

2. Related Art

A storage device may include a storage medium for temporarily or permanently storing data. During various operations such as write, read, transmission, and processing, a data error or data corruption may occur.

In order to ensure the reliability of data, the storage device may use error correction techniques such as error correction encoding and error correction decoding.

SUMMARY

Embodiments provide a memory controller for shortening an error correction time by reducing unnecessary error correction decoding, and an operating method of the memory controller.

In accordance with an aspect of the present disclosure, there is provided a memory controller including: a read controller configured to sequentially perform a plurality of read retry operations on a memory device; and an error correction circuit configured to perform a plurality of first error correction decoding on read data respectively produced by the plurality of read retry operations, store a plurality of Unsatisfied Syndrome Check (USC) values acquired from the plurality of first error correction decoding, and perform a second error correction decoding, based on read data corresponding to a minimum USC value among the plurality of USC values.

In accordance with another aspect of the present disclosure, there is provided a memory controller including: a read controller configured to perform a read retry operation on a memory device; and an error correction circuit configured to perform a first error correction decoding on read data acquired from the read retry operation, update a minimum Unsatisfied Syndrome Check (USC) value based on a comparison of a target USC value acquired from the first error correction decoding with the minimum USC value, and perform a second error correction decoding on the read data acquired from the read retry operation when the minimum USC value is updated.

In accordance with still another aspect of the present disclosure, there is provided a method of operating a memory controller, the method including: a first phase of performing a read retry operation on a memory device; a second phase of performing a first error correction decoding on read data acquired from the read retry operation; a third phase of storing an Unsatisfied Syndrome Check (USC) acquired from the first error correction decoding; iteratively performing the first to third phases up to a threshold number of times; and performing a second error correction decoding having a higher performance than a performance of the first error correction decoding, based on read data corresponding to a minimum USC value among the stored USC values.

In accordance with still another aspect of the present disclosure, there is provided a method of operating a memory controller, the method including: performing a read retry operation on a memory device; performing first error correction decoding on read data acquired from the read retry operation; updating a minimum Unsatisfied Syndrome Check (USC) value according to a result obtained by comparing a target USC value acquired from the first error correction decoding with the minimum USC value; and performing second error correction decoding on the read data acquired from the read retry operation when the minimum USC value is updated.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and should not be construed as limited to the embodiments set forth herein.

Figure 1:
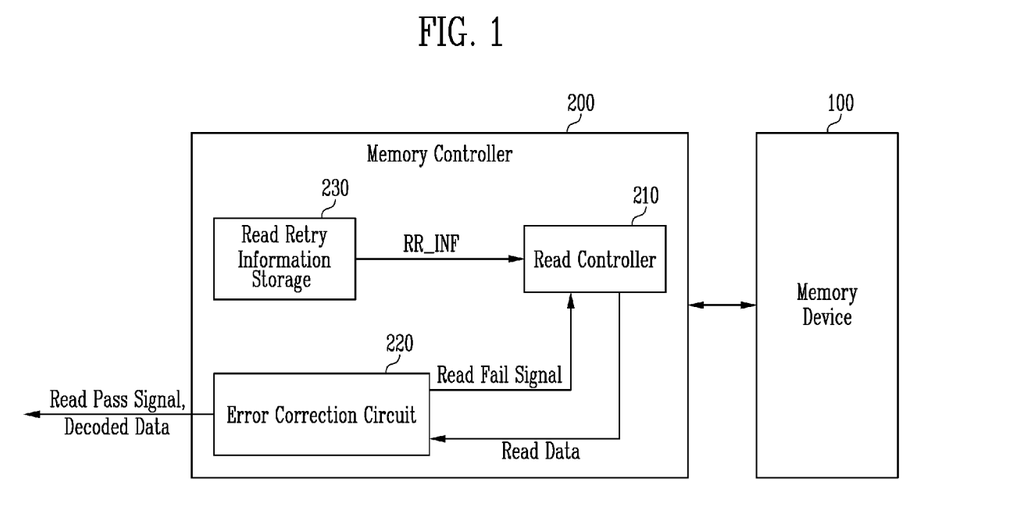
FIG. 1 is a diagram illustrating a configuration and an operation of a memory controller.

FIG. 1 is a diagram illustrating a configuration and an operation of a memory controller.

Referring to FIG. 1, the memory controller 200 may include a read controller 210 and an error correction circuit 220. The memory controller 200 may additionally include a read retry information storage 230.

The read controller 210 may perform a read retry operation on a memory device 100 with reference to read retry information RR_INF. The read controller 210 may provide the error correction circuit 220 with read data acquired from the read retry operation from the memory device 100.

The error correction circuit 220 may receive the read data from the read controller 210. The read data may be data obtained by reading encoded data stored in the memory device 100. The error correction circuit 220 may perform error correction decoding by using the read data and a parity check matrix. The error correction circuit 220 may us a Low Density Parity Check (LDPC) code as an error correction code.

The error correction circuit 220 may perform the error correction decoding by using various algorithms employing an iterative decoding scheme. The error correction decoding begins with calculation of a syndrome.

The syndrome is a binary vector which can be obtained from an Error Correction Code (ECC) chunk, and include information on an error pattern which is to be corrected. The number of '1s' among entries included in the syndrome may be a number proportionate to a number of error bits remaining in the ECC chunk. The entries included in the syndrome may correspond to nodes on a Tanner graph, and the nodes which are not '0' may respectively be Unsatisfied Check Nodes (UCNs). An unsatisfied Syndrome Check (USC) is a number of UCNs, and may be an index for estimating a level of an error. In the error correction decoding using the LDPC code, an operation of reversing bit values estimated as an error in a chunk is iterated. Accordingly, the syndrome is also changed, and the changed value is continuously tracked.

The algorithms used in the error correction decoding may include a bit-flipping algorithm, a sum-product algorithm, a min-sum algorithm, a scaled min-sum algorithm, and the like. However, the kinds of algorithms used are not limited to those disclosed in the present disclosure.

The error correction circuit 220 may perform one or more iterations of decoding within a set threshold number of times. When a valid codeword satisfying constraints of the parity check matrix of the error correction code is generated by iterating within the threshold number of times, the error correction circuit 220 may output, as decoded data, the generated valid codeword together with a read pass signal. When the valid codeword satisfying the constraints of the parity check matrix of the error correction code is not generated by iterating within the threshold number of times, the error correction circuit 220 may output a read fail signal representing that the error correction decoding has failed.

The error correction circuit 220 may perform a first error correction decoding using an algorithm having low complexity, low performance, low power consumption, or a combination thereof, and perform a second error correction decoding using a different algorithm having higher complexity, higher performance, higher power consumption, or a combination thereof relative to the first error correction decoding. For example, the error correction circuit 220 may performing the first error correction decoding based on a bit-flipping algorithm, and perform the second error correction decoding based on a min-sum algorithm.

When the first error correction decoding or the second error correction decoding is successful, the error correction circuit 220 may output the decoded data together with the read pass signal. Iterations of the second error correction decoding may correspond to respective read retry operations, and when the second error correction decoding continues to fail until the read retry operation is iteratively performed up to the threshold number of times, the error correction circuit 220 may output the read fail signal to the read controller 210.

The read retry information storage 230 may store read retry information RR_INF including parameters associated with a plurality of read retry operations. The read retry information RR_INF may include parameter values corresponding to each read retry operation up to the threshold number of times, including a read retry voltage level, a read retry voltage applying time, a pass voltage level, a pass voltage applying time, and the like for each iteration of the read retry operation. Because different voltage levels may be used in the respective read retry operations, the respective read data produced by the read retry operations may differ, and in particular the values read out for cells corresponding to error bits may differ.

In an embodiment, the read controller 210 may sequentially perform a plurality of read retry operation on the memory device 100. The read controller 210 may perform a read retry operation whenever receiving the read fail signal. The read controller 210 may iteratively perform the read retry operation up to the threshold number of times.

The error correction circuit 220 may perform the first error correction decoding on read data respectively acquired from the plurality of read retry operations. The error correction circuit 220 may store a plurality of USC values acquired from the first error correction decoding. The error correction circuit 220 may perform the second error correction decoding, based on read data corresponding to a minimum USC value among the plurality of USC values. The error correction circuit 220 may perform the second error correction decoding, based on the read data corresponding to the minimum USC value, after a last read retry operation among the plurality of read retry operation is completed.

In an embodiment, the read controller 210 may perform read retry operations on the memory device 100 until receiving the read pass signal within the threshold number of times. The read controller 210 may perform a next read retry operation when the minimum USC value is not updated after a most recent read retry operation is performed. The read controller 210 may perform the next read retry operation when the minimum USC value is updated after the most recent read retry operation and the second error correction decoding performed using the read data from the most recent read retry operation fails.

The error correction circuit 220 may perform the first error correction decoding on read data acquired from a read retry operation. The error correction circuit 220 may update the minimum USC value, based on a result obtained by comparing a target USC value acquired from the first error correction decoding with the minimum USC value. A minimum USC initial value may be a USC value acquired from a history read operation performed before the read retry operation.

When the target USC value is smaller than the minimum USC value, the error correction circuit 220 may update the minimum USC value to be equal to the target USC value.

When the target USC value is equal to or greater than the minimum USC value, the error correction circuit 220 does not update the minimum USC value but may maintain the minimum USC value. When the minimum USC value is updated, the error correction circuit 220 may perform the second error correction decoding on the read data acquired from the read retry operation.

Figure 2:
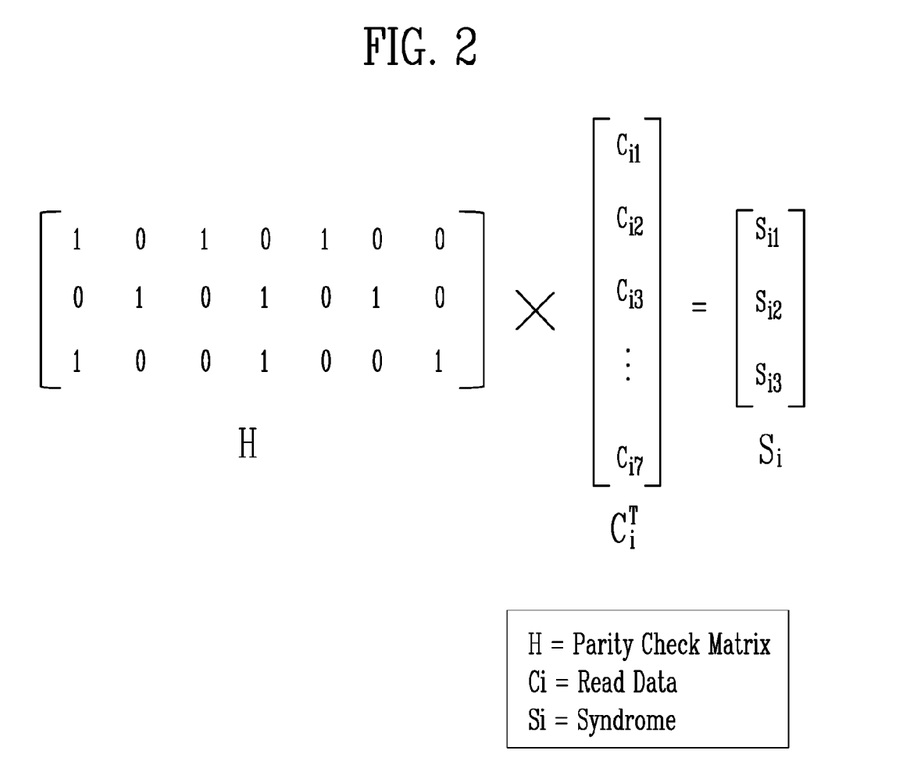
FIG. 2 is a diagram illustrating a syndrome and a USC value in error correction decoding.

FIG. 2 is a diagram illustrating a syndrome and a USC value in error correction decoding.

Referring to FIG. 2, a syndrome Si may be generated based on a parity check matrix H and a preposition $Ci^T$ of hard-decision data Ci corresponding to an $i^{th}$ iteration. First hard-decision data C1 may be data read from the memory device.

Entries of the hard-decision data Ci represent hard-decision values corresponding to the $i^{th}$ iteration of variable nodes on a Tanner graph. The entries of the syndrome Si corresponds to check nodes on the Tanner graph.

When all the entries of the syndrome Si are '0,' i.e., when the USC value is 0, this represents that a syndrome check passes in a corresponding iteration. When the syndrome check passes, error correction decoding also passes. Therefore, the error correction decoding may be ended, and the hard-decision data Ci corresponding to the $i^{th}$ iteration may be output as decoded data.

When at least one entry among all the entries of the syndrome Si is not '0,' i.e., when the USC value is not 0, this represents that the syndrome check fails in a corresponding iteration. This means that error correction decoding has not succeeded in the corresponding iteration. Therefore, a next error correction decoding may be iteratively performed when a number of times the error correction decoding has been performed has not reached the threshold number of times.

Figure 3:
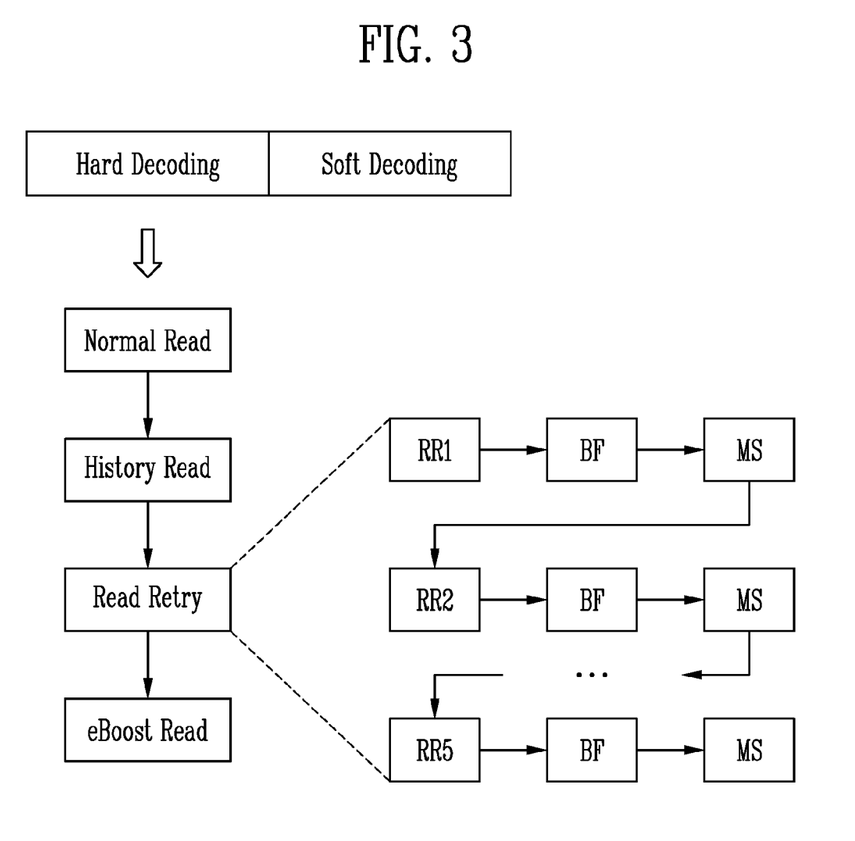
FIG. 3 is a diagram illustrating a defense algorithm flow for recovering read data in a read operation fail.

FIG. 3 is a diagram illustrating a defense algorithm flow for recovering read data in a read operation fail.

Referring to FIG. 3, when a read operation fails, a defense algorithm may be performed in an order of hard decoding and soft decoding so as to recover read data. In the soft decoding, a number of correctable error bits is greater than a number of correctable error bits in the hard decoding. However, in the soft decoding, more time and power may be consumed compared with the hard decoding.

When a normal read fails in the hard decoding, a history read, a read retry, and an eboost read may be sequentially performed. However, embodiments are not limited as to the order in which each read is performed. The normal read may be a read operation performed using a predetermined read voltage value. The history read may be a read operation performed using a read voltage value of a read operation which previously succeeded. The read retry may be a read operation performed using a read voltage value included in read retry information (i.e., a read retry voltage value); in an embodiment such as shown in FIG. 3, one or more read retries (RR1, RR2, and RR3) may be performed using respective read voltage values. The eboost read may be a read operation performed using a searched optimum read voltage value.

In FIG. 3, first error correction decoding may be performed on read data acquired from a read retry operation. The first error correction decoding may be performed based on a bit-flipping (BF) algorithm. When the first error correction decoding fails, second error correction decoding may be performed on the read data. The second error correction decoding may be performed based on a min-sum (MS) algorithm. When the second error correction decoding fails, a next read retry operation may be performed by changing a read parameter. As described above, the iteration of the read retry operation may be performed up to a threshold number of times.

Figure 4:
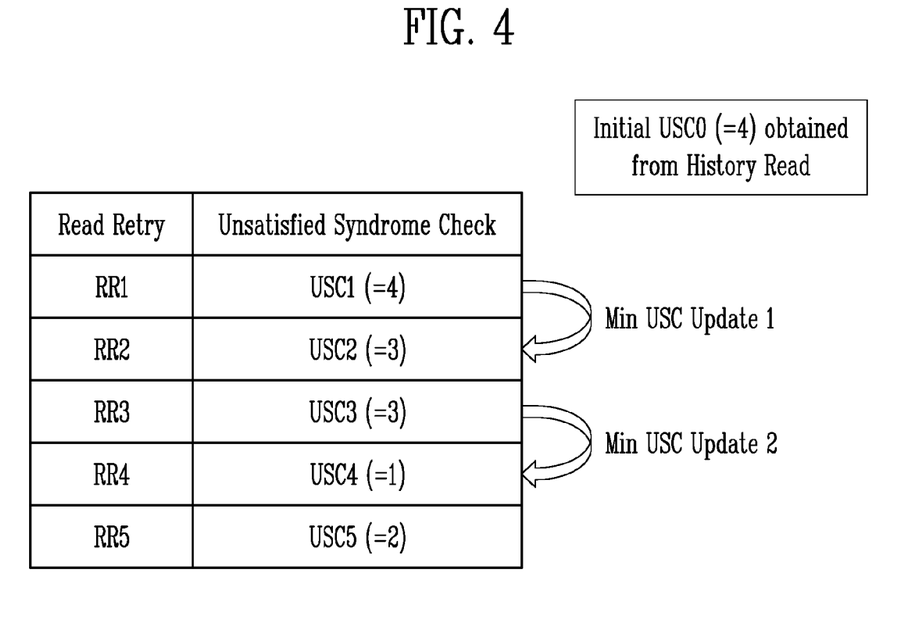
FIG. 4 is a diagram illustrating a relationship between a read retry operation and a USC value in accordance with an embodiment of the present disclosure.

FIG. 4 is a diagram illustrating a relationship between a read retry operation and a USC value in accordance with an embodiment of the present disclosure.

Referring to FIG. 4, a plurality of read retry operations RR1 to RR5 may be performed based on a read parameter included in read retry information. A threshold number of times the read retry operation is performed may be 5. In other words, the read retry operation may be iteratively performed up to a maximum of five times. The value of a threshold number of times is not limited to this embodiment.

USC0 as a USC initial value may be a USC value acquired from the history read operation described with reference to FIG. 3. USC1 may be a USC value acquired by performing first error correction decoding on read data acquire from a first read retry operation RR1. USC2 may be a USC value acquired by performing the first error correction decoding on read data acquired from a second read retry operation RR2. In this manner, USC5 may be a USC value acquired by performing the first error correction decoding on read data acquired from a fifth read retry operation RR5.

Figure 5:
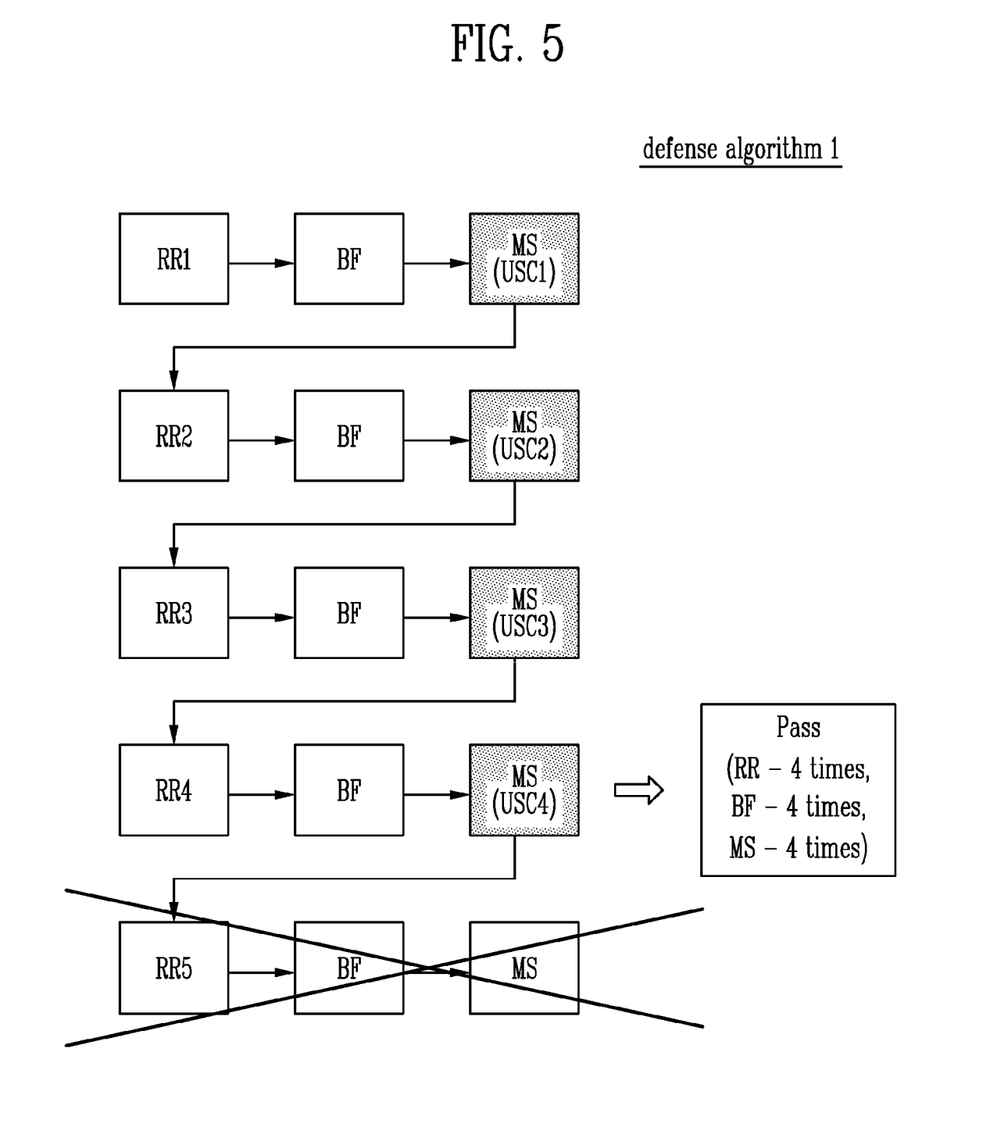
FIG. 5 is a diagram illustrating a defense algorithm flow applied in a read retry operation in accordance with an embodiment of the present disclosure.

FIG. 5 is a diagram illustrating a defense algorithm flow applied in a read retry operation in accordance with an embodiment of the present disclosure.

Referring to FIG. 5, when a first error correction decoding on read data acquired from a read retry operation fails, a second error correction decoding may be performed on all read data acquired from each read retry operation. The first error correction decoding may be performed based on a bit-flipping algorithm, and the second error correction decoding may be performed based on a min-sum algorithm. The second error correction decoding may have a performance higher than performance of the first error correction decoding but have a performance time longer than a performance time of the first error correction decoding.

According to a first defense algorithm, the second error correction decoding is performed for each read retry operation. Therefore, when referring to a USC value as an index representing a degree of an error, the second error correction decoding is unnecessarily performed even though it is expected that the probability that the second error correction decoding will fail will be high. Accordingly, the whole error correction decoding time may be lengthened.

That is, referring to FIG. 4, when assuming that the second error correction decoding on read data corresponding to USC4 passes, according to the first defense algorithm, the read retry operation may be performed four times, the first error correction decoding may be performed four times, and the second error correction decoding may be performed four times, until the second error correction decoding passes. The contribution of the second error correction decoding to the whole error correction decoding time is greater than the contribution of the first error correction decoding and the read retry operation to the whole error correction decoding time, and therefore, the whole error correction decoding time may increase.

Figure 6:
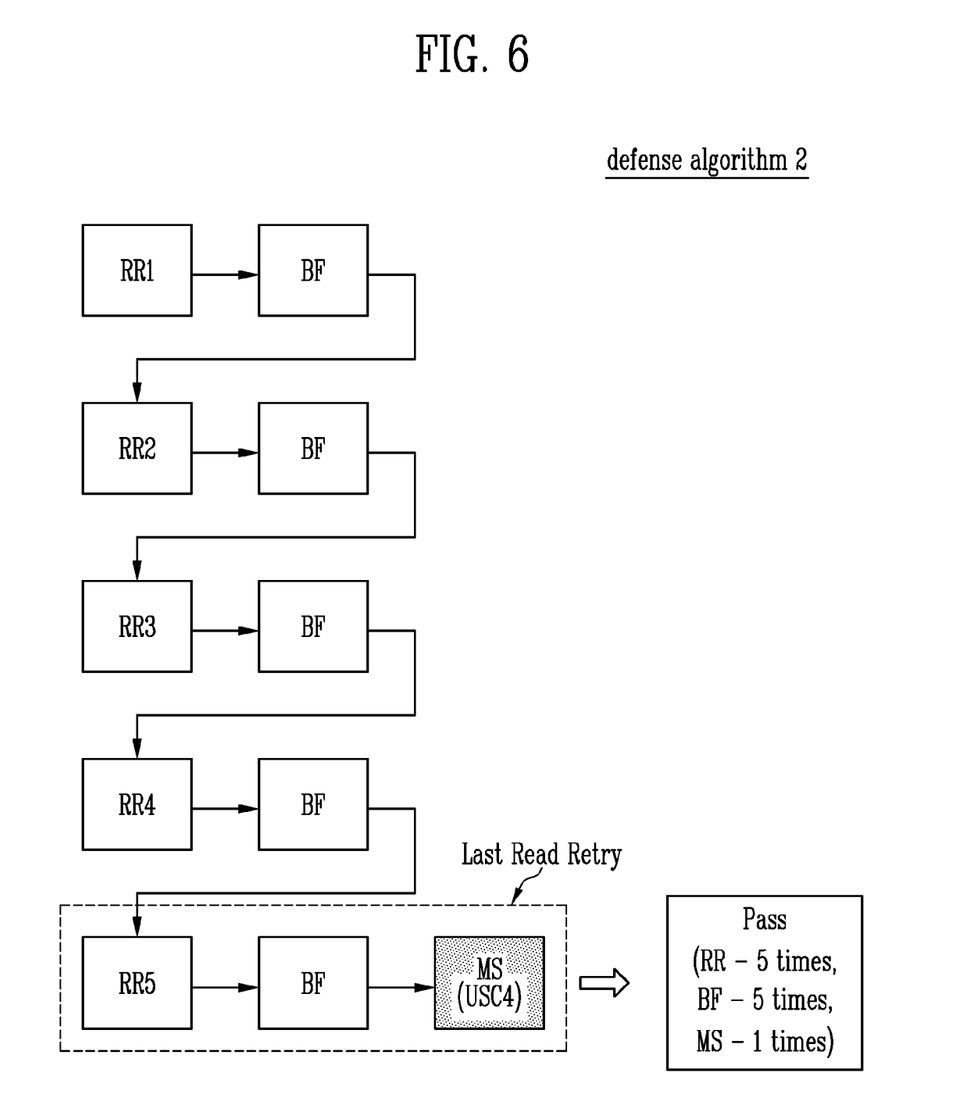
FIG. 6 is a diagram illustrating a defense algorithm flow applied in a read retry operation in accordance with an embodiment of the present disclosure.

FIG. 6 is a diagram illustrating a defense algorithm flow applied in a read retry operation in accordance with an embodiment of the present disclosure.

Referring to FIG. 6, when the first error correction decoding on read data acquired from a read retry operation fails, the read retry operation may be performed up to a threshold number of times. Second error correction decoding may be performed after a last read retry operation is completed. The first error correction decoding may be performed based on a bit-flipping algorithm, and the second error correction decoding may be performed based on a min-sum algorithm. The second error correction decoding may have a performance higher than a performance of the first error correction decoding but have a performance time longer than a performance time of the first error correction decoding.

The second error correction decoding may be performed on read data corresponding to a minimum USC value among USC values corresponding to each read retry operation. Referring to FIG. 4, the second error correction decoding may be performed on read data acquired from a fourth read retry operation RR4 corresponding to USC4 as the minimum USC value.

According to a second defense algorithm, the second error correction decoding is not performed for each read retry operation, but may be performed on only read data corresponding to the minimum USC value because a USC value is an index representing a degree of an error. Accordingly, the second error correction decoding can be prevented from being unnecessarily performed, and the whole error correction decoding time can be shortened.

That is, referring to FIG. 4, in a case where the second error correction decoding on read data corresponding to USC4 passes, according to the second defense algorithm, the read retry operation may be performed five times, the first error correction decoding may be performed five times, and the second error correction decoding may be performed once, until the second error correction decoding passes. Thus, unnecessary performance of the second error correction decoding is reduced as compared with the first defense algorithm described with reference to FIG. 5, so that the whole error correction decoding time can be shortened.

Figure 7:
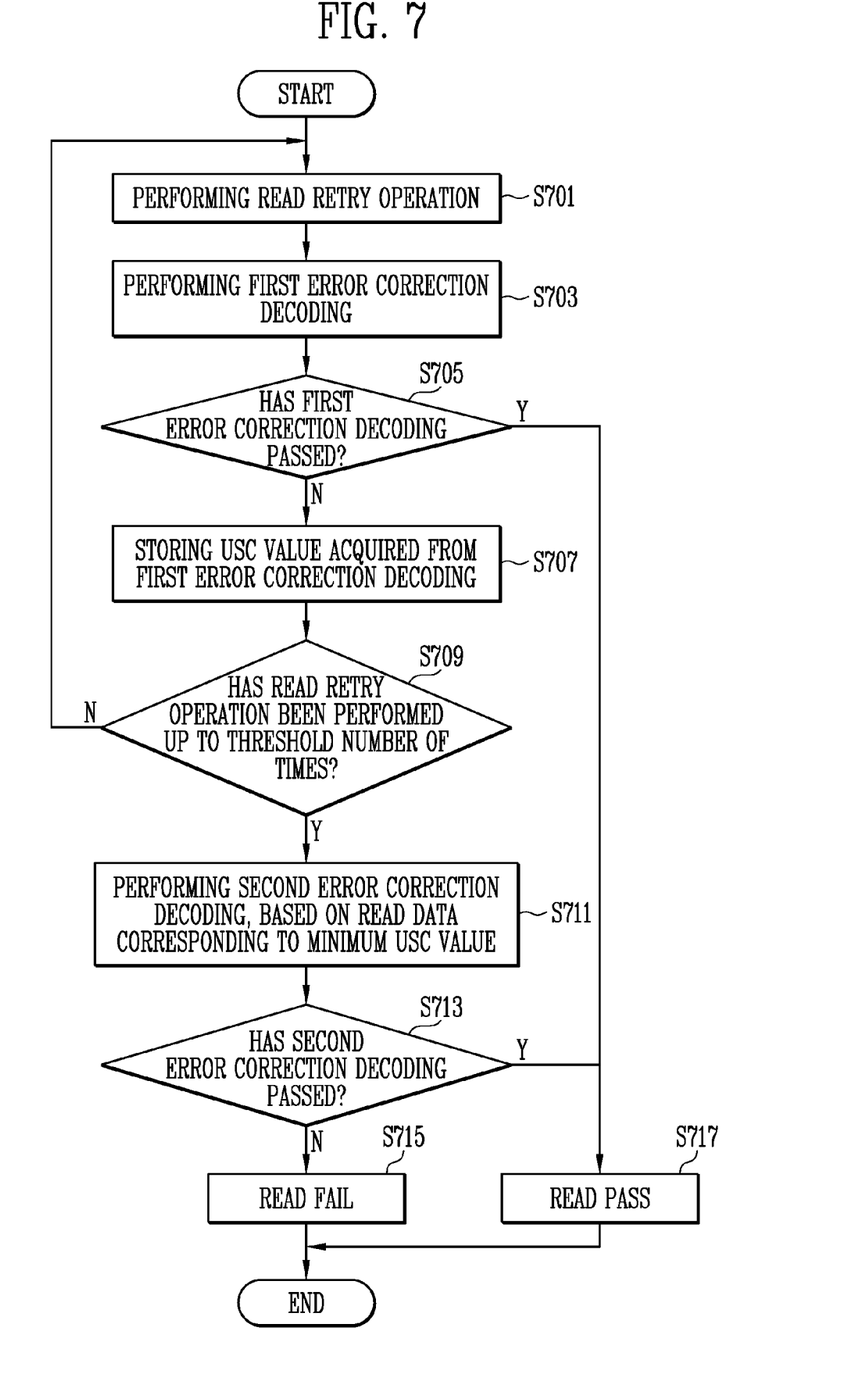
FIG. 7 is a flowchart illustrating an operation of the memory controller according to the defense algorithm flow described with reference to FIG. 6.

FIG. 7 is a flowchart illustrating an operation of the memory controller according to the defense algorithm flow described with reference to FIG. 6.

Referring to FIG. 7, in step S701, the memory controller may perform a read retry operation. In embodiments, read data acquired from each performance of the read retry operation in step S701 may be retained for use in the defense algorithm at least until one of steps S711 or S717 is subsequently performed; that is, until the read data is no longer potentially required by the defense algorithm.

In step S703, the memory controller may perform first error correction decoding on the read data acquired from the read retry operation. The first error correction decoding may be performed based on a bit-flipping algorithm.

In step S705, the memory controller may determine whether the first error correction decoding has passed. When the first error correction decoding passes, the memory controller proceeds to step S717. When the first error correction decoding fails, the memory controller proceeds to step S707.

In the step S707, the memory controller may store a USC value acquired from the first error correction decoding. In some embodiments, the memory controller may also store an indication of which of the read data acquired in step S701 the stored USC value corresponds to.

In step S709, the memory controller may determine whether the read retry operation has been performed up to a threshold number of times since the beginning of the defense algorithm of FIG. 7. When the determination is that the read retry operation has been performed up to the threshold number of times since the beginning of the defense algorithm, the memory controller proceeds to step S711. When the determination is that the read retry operation has been performed less than the threshold number of times since the beginning of the defense algorithm, the memory controller proceeds to step S701.

In the step S711, the memory controller may perform second error correction decoding, based on read data corresponding to a minimum USC value among a plurality of stored USC values. The second error correction decoding may be performed based on a min-sum algorithm.

In step S713, the memory controller may determine whether the second error correction decoding has passed. When the determination is that the second error correction decoding passed, the memory controller proceeds to step S717. When the determination is that the second error correction decoding failed, the memory controller proceeds to step S715.

In the step S715, the memory controller may process a result of a read operation as a fail.

In the step S717, the memory controller may process the result of the read operation as pass, and output decoded data.

Figure 8:
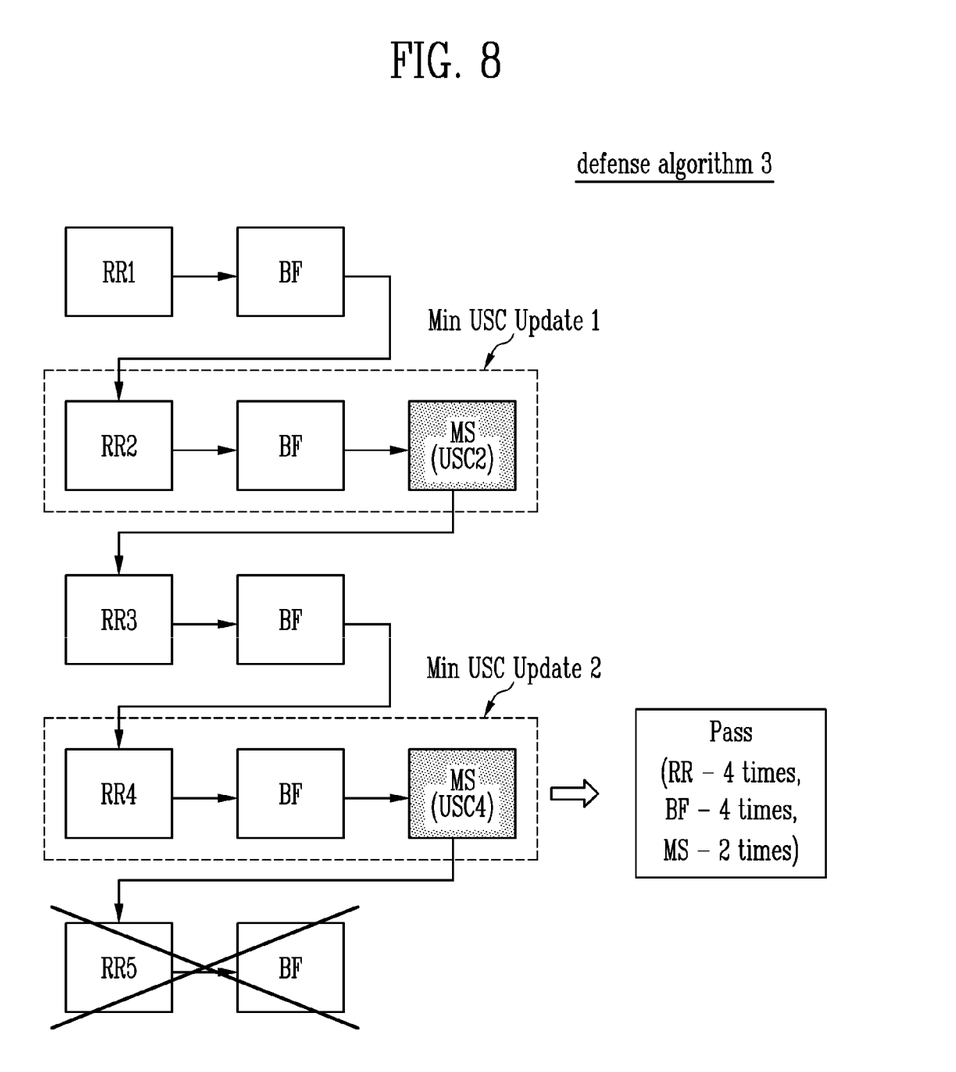
FIG. 8 is a diagram illustrating a defense algorithm flow applied in a read retry operation in accordance with an embodiment of the present disclosure.

FIG. 8 is a diagram illustrating a defense algorithm flow applied in a read retry operation in accordance with another embodiment of the present disclosure.

Referring to FIG. 8, in the case that first error correction decoding on read data acquired from a read retry operation fails, the read retry operation may be performed until second error correction decoding passes within a threshold number of times. The second error correction decoding may be performed whenever a minimum USC value is updated. That is, even when the read retry operation has not been performed entirely up to the threshold number of times, the second error correction decoding may be performed in the middle.

According to a third defense algorithm, the second error correction decoding is not performed for each read retry operation but performed only when the minimum USC value is updated. Therefore, when the minimum USC value is not updated, the performance of the second error correction decoding may be omitted. Accordingly, the second error correction decoding can be prevented from being unnecessarily performed, and the whole error correction decoding time can be shortened.

For example, referring to FIG. 4, a minimum USC initial value may be 4 as USC0. Since USC1 corresponding to the first read retry operation RR1 is 4, the USC1 is equal to the existing minimum USC value of 4. Therefore, the minimum USC value is not updated but may be maintained. Since USC2 corresponding to the second read retry operation RR2 is 3, the USC2 is smaller than the existing minimum USC value of 4. Therefore, the minimum USC value may be updated from 4 to 3. Since the minimum USC value has been updated, the second error correction decoding on read data corresponding to the USC2 may be performed.

When the second error correction decoding fails, a third read retry operation RR3 as a next order may be performed. Since USC3 corresponding to the third read retry operation RR3 is 3, the USC3 is equal to the existing minimum USC value of 3. Therefore, the minimum USC value is not updated but may be maintained. Since USC4 corresponding to the fourth read retry operation RR4 is 1, the USC4 is smaller than the existing minimum USC value of 3. Therefore, the minimum USC value may be updated from 3 to 1. Since the minimum USC value has been updated, the second error correction decoding on read data corresponding to the USC4 may be performed.

In the case where the second error correction decoding on the read data corresponding to the USC4 passes, according to the third defense algorithm, the read retry operation may be performed four times, the first error correction decoding may be performed four times, and the second error correction decoding may be performed twice, until the second error correction decoding passes. Thus, unnecessary performance of the second error correction decoding is reduced as compared with the first defense algorithm described with reference to FIG. 5, so that the whole error correction decoding time can be shortened.

Figure 9:
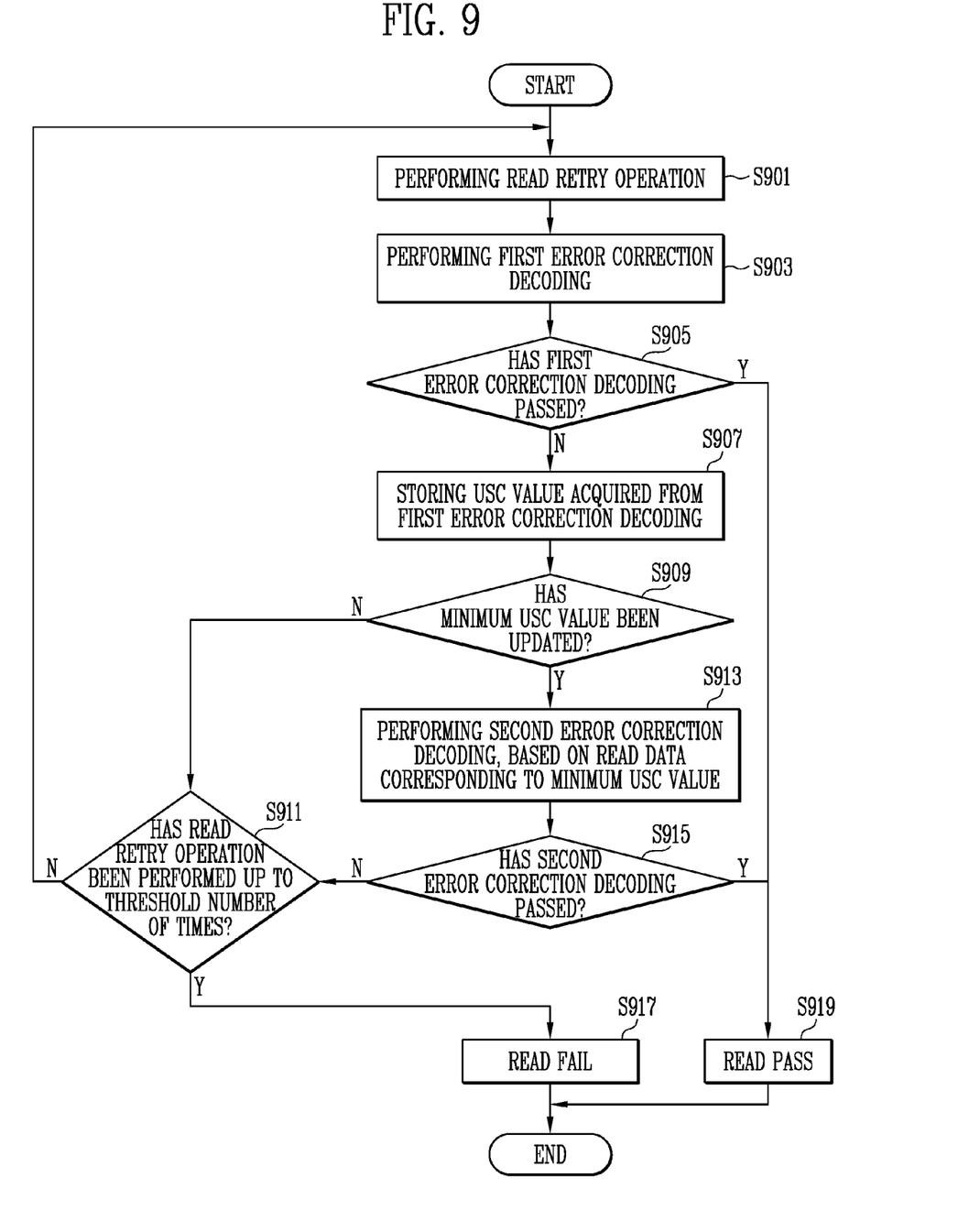
FIG. 9 is a flowchart illustrating an operation of the memory controller according to the defense algorithm flow described with reference to FIG. 8.

FIG. 9 is a flowchart illustrating an operation of the memory controller according to the defense algorithm flow described with reference to FIG. 8.

Referring to FIG. 9, in step S901, the memory controller may perform a read retry operation. Read data acquired from each performance of the read retry operation in step S901 may be retained for use in the defense algorithm at least until one of steps S911, S913, or S919 are subsequently performed; that is, until the read data is no longer potentially required by the defense algorithm.

In step S903, the memory controller may perform first error correction decoding on the read data acquired from the read retry operation. The first error correction decoding may be performed based on a bit-flipping algorithm.

In step S905, the memory controller may determine whether the first error correction decoding has passed. When the first error correction decoding passes, the memory controller proceeds to step S919. When the first error correction decoding fails, the memory controller proceeds to step S907.

In the step S907, the memory controller may store a USC value acquired from the first error correction decoding. Furthermore, the memory controller may determine whether to update a minimum USC value based on the USC value acquired from the first error correction decoding. In embodiments, the memory controller updates the minimum USC value when the USC value acquired from the first error correction decoding is less than the minimum USC value, and does not update the minimum USC value otherwise.

In step S909, the memory controller may determine whether the minimum USC value was updated in step S907. When the determination is that the minimum USC value was updated, the memory controller proceeds to step S913. When the determination is that the minimum USC value was not updated, the memory controller proceeds to step S911.

In the step S911, the memory controller may determine whether the read retry operation has been performed up to a threshold number of times since the beginning of the defense algorithm of FIG. 9. When the determination is that the read retry operation has been performed the threshold number of times since the beginning of the defense algorithm, the memory controller proceeds to step S917. When the determination is that the read retry operation has been performed less than the threshold number of times since the beginning of the defense algorithm, the memory controller proceeds to step S901.

In the step S913, the memory controller may perform second error correction decoding based on read data corresponding to the updated minimum USC value. The second error correction decoding may be performed based on a min-sum algorithm.

In step S915, the memory controller may determine whether the second error correction decoding has passed. When the determination is that the second error correction decoding passed, the memory controller proceeds to the step S919. When the determination is that the second error correction decoding fails, the memory controller proceeds to the step S911.

In the step S917, the memory controller may process a result of a read operation as failed.

In the step S919, the memory controller may process the result of the read operation as passed, and output decoded data.

In accordance with the present disclosure, there can be provided a memory controller for shortening an error correction time by reducing unnecessary error correction decoding, and an operating method of the memory controller.

While the present disclosure has been shown and described with reference to certain illustrative embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described illustrative embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the illustrative embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory controller comprising:
a read controller configured to sequentially perform a plurality of read retry operations on a memory device; and
an error correction circuit configured to perform a plurality of first error correction decodings on read data respectively acquired from the plurality of read retry operations, store a plurality of Unsatisfied Syndrome Check (USC) values respectively produced by the plurality of first error correction decodings, and only perform a second error correction decoding, which has a higher performance than the first error correction decoding, after a last read retry operation among the plurality of read retry operations is completed, based on read data corresponding to a minimum USC value among the plurality of USC values.

2. The memory controller of claim 1, wherein the error correction circuit outputs a read pass signal when the first error correction decoding or the second error correction decoding passes, and outputs a read fail signal when the second error correction decoding fails.

3. The memory controller of claim 1, wherein the error correction circuit performs the first error correction decoding based on a bit-flipping algorithm, and performs the second error correction decoding based on a min-sum algorithm.

4. The memory controller of claim 1, further comprising:
a read retry information storage configured to store read retry information including parameters respectively associated with the plurality of read retry operations, wherein the read controller performs the plurality of read retry operations based on the read retry information.

5. A memory controller comprising:

a read controller configured to perform a read retry operation on a memory device; and an error correction circuit configured to perform a first error correction decoding on read data acquired from the read retry operation, update a minimum Unsatisfied Syndrome Check (USC) value based on a comparison of a target USC value produced by the first error correction decoding with the minimum USC value, and perform a second error correction decoding, which has a higher performance than the first error correction decoding, on the read data acquired from the read retry operation in response to an update of the minimum USC value.

6. The memory controller of claim 5, wherein an initial value of minimum USC value is a USC value acquired from a history read operation performed prior to the read retry operation.

7. The memory controller of claim 5, wherein when the comparison indicates that the target USC value is smaller than the minimum USC value, the error correction circuit updates the minimum USC value as the target USC value.

8. The memory controller of claim 5, wherein when the comparison indicates that the target USC value is equal to or greater than the minimum USC value, the error correction circuit maintains the minimum USC value.

9. The memory controller of claim 5, wherein when the second error correction decoding passes, the error correction circuit outputs a read pass signal.

10. The memory controller of claim 5, wherein when the first error correction decoding and the second error correction decoding fail and a number of times the read retry operation has been performed is equal to or greater than a threshold number of times, the error correction circuit outputs a read fail signal.

11. The memory controller of claim 5, wherein the error correction circuit performs the first error correction decoding based on a bit-flipping algorithm, and performs the second error correction decoding based on a min-sum algorithm.

12. The memory controller of claim 5, wherein when the minimum USC value is not updated, the read controller performs a next read retry operation.

13. The memory controller of claim 5, wherein when the second error correction decoding fails, the read controller performs a next read retry operation.

14. The memory controller of claim 5, further comprising a read retry information storage configured to store read retry information including respective parameters associated with a plurality of read retry operations, wherein the read controller changes a read parameter based on read parameters of the retry information corresponding to the read retry operation, and iteratively performs the read retry operation.

15. A method of operating a memory controller, the method comprising:

a first phase of performing a read retry operation on a memory device;

a second phase of performing a first error correction decoding on read data acquired from the read retry operation;

a third phase of storing an Unsatisfied Syndrome Check (USC) acquired from the first error correction decoding;

iteratively performing the first to third phases up to a threshold number of times; and performing a second error correction decoding, which has a higher performance than the first error correction decoding, after iterations of the first to third phases up to the threshold number of times are completed, based on read data corresponding to a minimum USC value among the stored USC values.

16. The method of claim 15, further comprising:

outputting a read pass signal when the first error correction decoding or the second error correction decoding passes; and outputting a read fail signal when the second error correction decoding fails.

17. A method of operating a memory controller, the method comprising:

performing a read retry operation on a memory device;

performing first error correction decoding on read data acquired from the read retry operation;

updating a minimum Unsatisfied Syndrome Check (USC) value according to a result obtained by comparing a target USC value acquired from the first error correction decoding with the minimum USC value; and performing second error correction decoding, which has a higher performance than the first error correction decoding, on the read data acquired from the read retry operation in response to an update of the minimum USC value.

18. The method of claim 17, wherein the updating of the minimum USC value incudes:

updating the minimum USC value to the target USC value when the target USC value is smaller than the minimum USC value; and maintaining the minimum USC value when the target USC value is equal to or greater than the minimum USC value.

19. The method of claim 17, further comprising performing a next read retry operation when the minimum USC value is not updated or the second error correction decoding fails.

20. The method of claim 17, further comprising:

outputting a read pass signal when the second error correction decoding passes; and outputting a read fail signal when the first error correction decoding and the second error correction decoding fail and a number of times the read retry operation has been performed is equal to or greater than a threshold number of times.

* * * * *